United States Patent
Calabrese et al.

(10) Patent No.: US 9,171,726 B2
(45) Date of Patent: Oct. 27, 2015

(54) LOW NOISE SEMICONDUCTOR DEVICES

(75) Inventors: Giovanni Calabrese, Munich (DE);
Domagoj Siprak, Munich (DE);
Wolfgang Molzer, Ottobrunn (DE);
Uwe Hodel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 575 days.

(21) Appl. No.: 12/614,362

(22) Filed: Nov. 6, 2009

(65) Prior Publication Data

US 2011/0108916 A1 May 12, 2011

(51) Int. Cl.
| | | |
|---|---|---|
| *H01L 21/76* | (2006.01) | |
| *H01L 21/265* | (2006.01) | |
| *H01L 29/06* | (2006.01) | |
| *H01L 29/08* | (2006.01) | |
| *H01L 29/66* | (2006.01) | |
| *H01L 29/78* | (2006.01) | |
| H01L 21/223 | (2006.01) | |

(52) U.S. Cl.
CPC .... *H01L 21/26586* (2013.01); *H01L 21/26506* (2013.01); *H01L 29/0619* (2013.01); *H01L 29/0653* (2013.01); *H01L 29/0847* (2013.01); *H01L 29/66659* (2013.01); *H01L 29/7835* (2013.01); *H01L 21/2236* (2013.01)

(58) Field of Classification Search
CPC .............. H01L 29/78; H01L 29/66621; H01L 29/66681
USPC ............................ 257/343, 369, 397; 438/221
See application file for complete search history.

(56) References Cited

U.S. PATENT DOCUMENTS

| | | | |
|---|---|---|---|
| 5,859,450 A | 1/1999 | Clark et al. | |
| 5,869,875 A * | 2/1999 | Hebert | 257/382 |
| 6,262,459 B1 | 7/2001 | Tung | |
| 6,376,296 B2 * | 4/2002 | Tung | 438/221 |
| 6,977,425 B2 * | 12/2005 | Yoshida et al. | 257/517 |
| 7,511,322 B2 * | 3/2009 | Jang | 257/292 |

(Continued)

FOREIGN PATENT DOCUMENTS

| | | |
|---|---|---|
| CN | 101312211 A | 11/2008 |
| DE | 19647324 | 5/1997 |
| TW | 200837951 A | 9/2008 |

OTHER PUBLICATIONS

Translated Chinese Office Action mailed May 28, 2012 for Chinese patent application No. 201010534614.X, a counterpart foreign application of U.S. Appl. No. 12/614,362, 20 pages.

(Continued)

*Primary Examiner* — Nathan Ha
(74) *Attorney, Agent, or Firm* — Lee & Hayes, PLLC

(57) ABSTRACT

Semiconductor devices may be configured to reduce noise in the devices. For example, a semiconductor device may be configured or made with a first doped region within a semiconductor substrate to operate as an extended drain region, a trench isolation region, a second doped region between the first doped region and the trench isolation region, wherein the trench isolation region and the second doped region may be at least partially formed within the first doped region. Additionally, or alternatively, the second doped region may be within the first doped region and at least partially surround the trench isolation region, the first and second doped regions may have the same conductivity type, and the second doped region may have a higher conductivity than the first doped region.

29 Claims, 6 Drawing Sheets

(56) References Cited

U.S. PATENT DOCUMENTS

| | | | |
|---|---|---|---|
| 8,101,479 B2* | 1/2012 | Parker et al. | 438/231 |
| 8,772,113 B2* | 7/2014 | Masuda et al. | 438/270 |
| 2001/0028096 A1 | 10/2001 | Ohguro et al. | |
| 2004/0035820 A1* | 2/2004 | Ouellet | 216/2 |
| 2004/0224469 A1* | 11/2004 | Lim et al. | 438/285 |
| 2005/0106847 A1 | 5/2005 | Hiruta et al. | |
| 2005/0167764 A1 | 8/2005 | Li | |
| 2005/0239672 A1* | 10/2005 | Mun et al. | 510/175 |
| 2008/0067615 A1* | 3/2008 | Kim | 257/408 |
| 2008/0179695 A1* | 7/2008 | Berthold et al. | 257/408 |
| 2008/0246080 A1* | 10/2008 | Ito et al. | 257/328 |
| 2008/0268611 A1 | 10/2008 | Li et al. | |
| 2008/0315306 A1* | 12/2008 | Yoo et al. | 257/339 |
| 2009/0004806 A1 | 1/2009 | Siprak | |
| 2009/0020811 A1* | 1/2009 | Voldman | 257/337 |
| 2009/0072308 A1* | 3/2009 | Chen et al. | 257/336 |
| 2009/0137092 A1* | 5/2009 | Narita et al. | 438/401 |
| 2009/0179211 A1* | 7/2009 | Yoo et al. | 257/98 |
| 2009/0236662 A1* | 9/2009 | Voldman | 257/337 |
| 2009/0302382 A1* | 12/2009 | Adan et al. | 257/334 |
| 2010/0025730 A1* | 2/2010 | Heikman et al. | 257/194 |
| 2010/0258904 A1* | 10/2010 | Li et al. | 257/532 |

OTHER PUBLICATIONS

Ma et al., "Introduction to Cadence LDMOS Model", Cadence Confidential, www.eigroup.org/cmc/minutes/4q05_presentations/ldmos_introduction_cmc.ppt, Dec. 2005, pp. 1-18.

US Patent Application Publication No. 2008/0290411, published Nov. 27, 2008, Lee "Semiconductor Device and Method for Fabricating the Same", 11 pages, equivalent to the previously cited Chinese Patent Application Publication No. CN101312211, published Nov. 26, 2008.

Translated Chinese Office Action mailed Apr. 9, 2013 for Chinese patent application No. 201010534614.X, a counterpart foreign application of U.S. Appl. No. 12/614,362, 25 pages.

Translated copy of the Chinese Office Action mailed Dec. 16, 2013 for Chinese patent application No. 201010534614.X, a counterpart foreign application of U.S. Appl. No. 12/614,362, 17 pages.

OA dated Dec. 12, 2014 for CN 201210570406.4 w/translation; 12 pages.

* cited by examiner

LOW NOISE SEMICONDUCTOR DEVICES

BACKGROUND

A Lateral Diffused Metal Oxide Semiconductor (LDMOS) transistor device is typically used to connect integrated circuits to high supply voltages beyond the internal operating voltages of the integrated circuit. The LDMOS device structure protects the gate dielectric of a transistor from dielectric breakdown due to high supply voltages by reducing the electrical field across the transistor gate oxide. The reduction of the electrical field in the "on" and "off" state is performed through a resistive element that additionally also forms an electrical field relieving structure. In the "on" state, the electrical field is released via the voltage drop across the resistive element. In the "off" state, the electrical field is reduced through the electrical field relieving structure.

In system on chip (SoC) solutions, a large amount of LDMOS devices are needed to supply different circuit parts with different supply voltages and to isolate different circuit parts, thus preventing influence on circuit performance due to supply voltage ringing through IR drops and inductive voltages generated in the supply lines during high and fast changing current supply. The LDMOS device is thus utilized for power management unit circuit parts of an integrated circuit or SoC solutions.

The area consumption of the LDMOS device is significantly determined by the flicker noise or, more generally speaking, by the low-frequency noise. The voltage noise of a LDMOS device operated in the linear region (i.e. "on" state) is given by the noise contributions from a first part, which extends from the source to the end of the transistor inversion channel and a second part, that extends from the end of the transistor inversion channel to the drain contact. The second part between the end of the transistor inversion channel and the drain contact contributes with a higher amount of noise to the total noise of the LDMOS device. So, it is desirable to reduce the noise of the second part. This increased noise contribution in the second part may originate from trapped charge associated with a trench isolation structure, which is a trench etched into the semiconductor substrate that is filled with one or more layers of dielectric material(s). The capture of a mobile charge through a trap or the emission of a trapped charge into the LDMOS current carrying mobile charge may be dependent on the distance between the trap and the mobile charge. The further the distance, the lower may be the probability for a charge capture or emission process. The influence of trapped charge in the dielectric material and/or at the semiconductor to dielectric interface on the mobile charge of the current may depend additionally on the distance between the trapped charge and the mobile charge.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are structures of a semiconductor device, such as an LDMOS, and systems and methods of forming semiconductor devices, such as LDMOS devices.

According to one implementation, an LDMOS device includes a first doped region (e.g., well) within a semiconductor substrate, a trench isolation region, a gate overlying at least a portion of the first doped region (e.g., well) and a least a portion of the trench isolation region, and a second doped region between the first doped region and the trench isolation region. The second doped region forms with the first doped region a p-n junction with a space charge region between the first doped and the second doped region.

According to another implementation, an LDMOS device includes a first doped region, a trench isolation region, and a second doped region within the first doped region at least partially surrounding the trench isolation region. The second doped region has the same conductivity type as the first doped region, may have a higher conductivity than the first doped region and is separated from the trench isolation region.

According to another implementation, an LDMOS device includes a doped region and a trench isolation region. At least a portion of the trench isolation includes an agent or impurity that quenches traps and so reduces noise, such as a halogen element or deuterium.

According to another implementation, a method of forming a trench isolation region in an LDMOS device includes forming a doped region within a semiconductor substrate, and forming a trench isolation region within the doped region. A noise reducing agent or dopant is included in at least one of the trench isolation region dielectric and dielectric to semiconductor (e.g. silicon) interface or interface region.

According to another implementation, a method of forming a trench isolation region in an LDMOS device includes forming a trench in the semiconductor substrate that contains a reduced amount of traps through a processing that generates a semiconductor surface inside the trench that contains a small surface roughness. According to another implementation a small surface roughness of the trench is supported through the use of dedicated surface orientations of the trench surfaces wherein the mentioned processing achieves different surface roughness for different surface orientations.

According to another implementation, a method of forming a trench isolation region in an LDMOS device includes forming a trench in the semiconductor substrate that contains a reduced amount of traps through the use of dedicated surface orientations of the semiconductor surfaces inside the trench with different amount of traps for different surface orientations.

Exemplary Devices

Figure 1A:
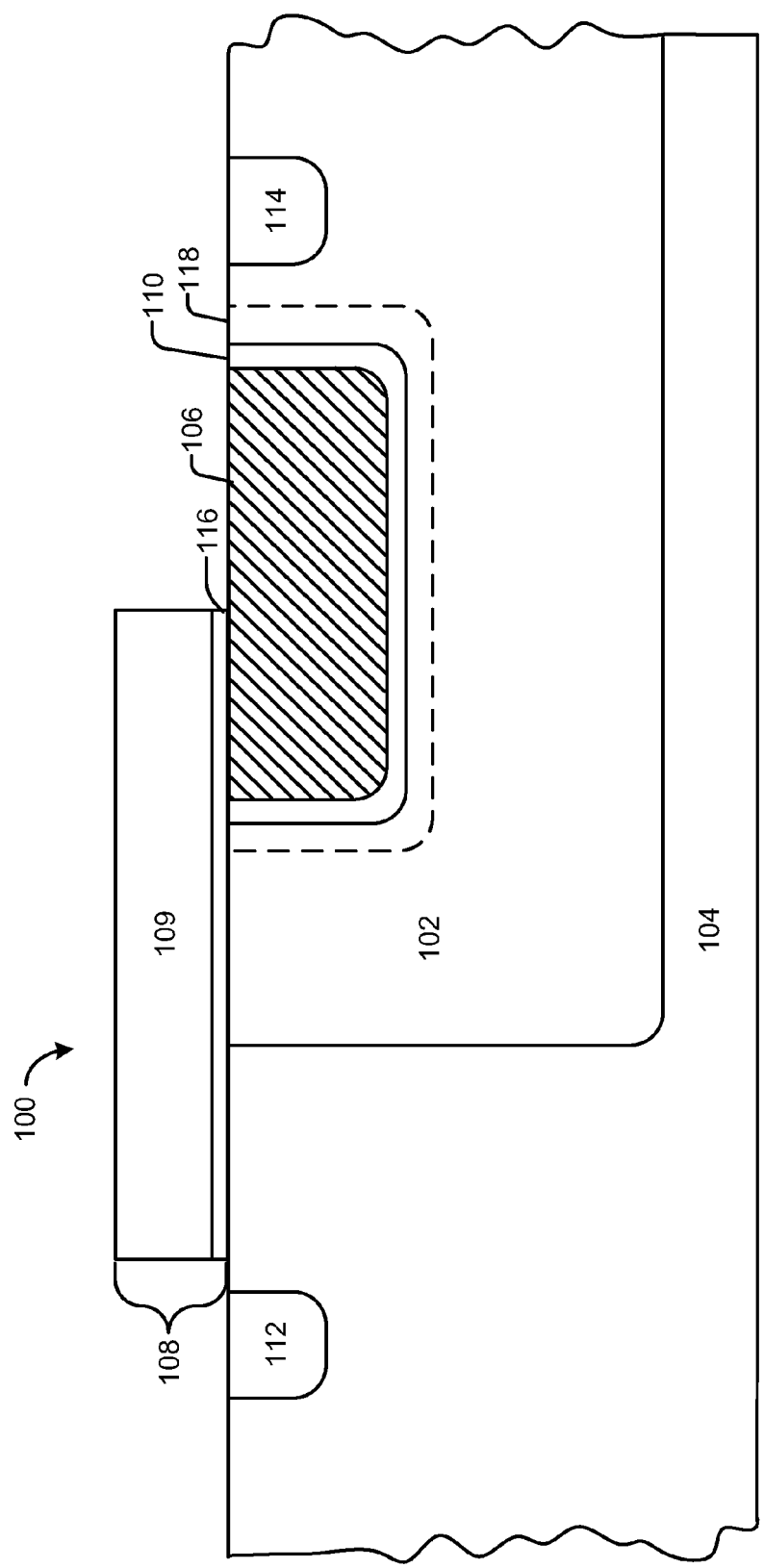
FIG. 1A is a simplified schematic diagram of a semiconductor device, such as an n-type LDMOS device, including a space charge region between the trench structure and the n-well according to one implementation.

FIG. 1A illustrates one example of a Lateral Diffused Metal Oxide Semiconductor (LDMOS) device 100 that includes a first doped region 102 within a semiconductor substrate 104. The device also includes a trench isolation region 106, a gate (i.e. a gate stack) 108 overlying at least a portion of the first doped region 102 and at least a portion of the trench isolation region 106, and a second doped region 110 between the first doped region 102 and the trench isolation region 106. FIG. 1A shows an implementation of an nLDMOS device, which has a p-type doped layer, region, or substrate 104, an n-type first doped region 102, and a p-type second doped region 110; however, one skilled in the art will notice that the device may similarly be formed as a pLDMOS by forming the respective regions with the opposite conductivity as shown.

The LDMOS device 100 generally includes a gate 108 (i.e. a gate stack), source region 112, and drain contact region 114. Substrate 104 may be doped with boron (B) or other suitable p-type dopant. Source region 112 and drain contact region 114 may be doped with arsenic (As), phosphorus (P), or other suitable n-type dopant, which may be introduced into the substrate by diffusion (such as solid state diffusion), ion implantation, plasma doping or other suitable dopant introduction technique. The gate (i.e. gate stack) 108 includes a gate electrode 109 and a gate dielectric layer 116, which separates the gate electrode 109 from the substrate 104. The gate electrode 109 may contain doped poly silicon or silicide or a metal or other suitable material. The gate dielectric layer 116 may include any dielectric material. The gate dielectric layer 116 may include at least one of an oxide (such as silicon dioxide), a nitride (such as silicon nitride) or an oxynitride (such as silicon oxynitride or a nitrided silicon oxide). The gate dielectric layer may include a high-k material (for example, hafnium oxide HfO2 or hafnium silicate HfSiON). Although the gate electrode 109 and the gate dielectric layer 116 are shown as single layers, either or both of these may be composed of multiple layers. For example, the gate dielectric may be formed of multiple dielectric layers having similar or different characteristics, such as dielectric constant and so forth. The multiple layers may, for example, be in the form of a stack of layers, i.e. they may form a stepwise graded dielectric. The dielectric layer may be formed of one layer but has locally different characteristics (as e.g. dielectric constants) in a continuously graded manner through the use of (a) diffused impurity(ies) in the dielectric with a concentration gradient in the dielectric layer.

The LDMOS device 100 also includes a first doped region 102, a trench isolation region 106 and a second doped region 110. The first doped region 102 may be doped n-type, may operate as an extended drain region, and may extend beneath the trench isolation region 106, to drain contact region 114 or beyond. The trench isolation region 106 may be formed with a trench within the first doped region 102. The trench isolation region 106 may be formed, for example, using thermal or plasma oxidation, nitridation, chemical vapor deposition (CVD) or other suitable dielectric formation technique to form an insulation material within the trench. The second doped region 110, which is doped p-type, is formed between the trench isolation region 106 and the first doped region 102. Dopant associated with the second doped region may extend into the trench isolation region, the trench isolation region defined by an interface between the semiconductor and the insulation material. A space charge region 118 may extend between the second doped region 110 and the first doped region 102 and may operate to separate current flow from the trench isolation region 106, increase tunnel potential barrier for charge trapping, and slow down hot carriers. Although the drain contact region 114 is shown as separated from the second doped region 110 and the space charge region 118, the drain contact region 114 may alternatively be adjacent to, or in contact with, the trench isolation region 106, the second doped region 110 and/or the space charge region 118.

The second doped region 110 and the space charge region 118 are configured to create a separation between potential traps in the trench isolation region 106 and/or in the interface between the trench isolation region 106 and the first (102) or second doped region 110, i.e. at the interface between the trench dielectric and the semiconductor substrate wherein the trench is formed. Thus, the distance between the mobile carriers and the trapped charge is increased to reduce the effect (e.g. noise) caused by electron traps in the dielectric material and/or at the interface between the dielectric material and the semiconductor. Through this configuration, the electrostatic influence of trapped charge on mobile charge, as well as tunneling probability for charge trapping, is reduced.

Figure 1B:
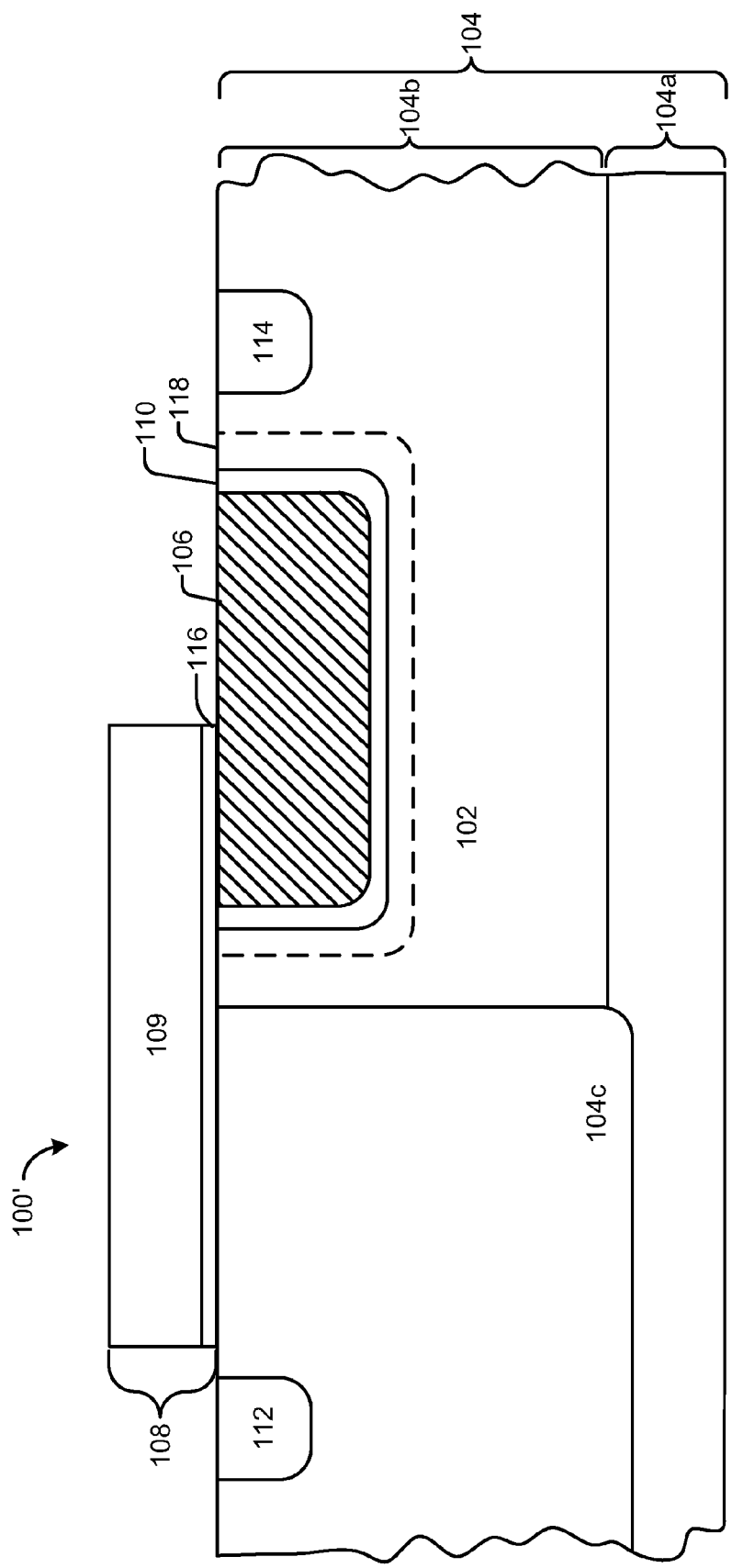
FIG. 1B is a simplified schematic diagram of a semiconductor device, such as a p-type LDMOS device, according to another implementation.

FIG. 1B illustrates an example of an LDMOS device 100', which is similar to LDMOS device 100 in that LDMOS device 100' includes a first doped region 102 within a semiconductor substrate 104. However, the substrate 104 includes a base substrate portion 104a and a device substrate portion 104b, both which may be formed of doped silicon or other suitable semiconductor material. The base substrate portion 104a may be doped to have a first conductivity type. The device substrate portion 104b may be formed to have a second conductivity type, opposite the first conductivity type. The device substrate portion 104b may be deposited, grown (such as epitaxially grown), generated via doping through diffusion (such as solid state diffusion), ion implantation, plasma doping or otherwise formed on the base substrate portion 104a. For example, the device substrate portion may be an epitaxial layer, which has been grown on the base substrate portion 104a. Doped region 104c may be formed by diffusion (such as solid state diffusion), ion implantation, plasma doping or otherwise introduced into device substrate portion 104b and may extend to, within, or beyond base substrate portion 104a. Alternatively, doped region 104c may be deposited, grown (such as epitaxially grown), generated via doping through (solid-state) diffusion, ion implantation, plasma doping or otherwise formed on the base substrate portion 104a and device substrate portion 104b may be formed by diffusion (such as solid state diffusion), ion implantation, plasma doping or otherwise introduced into doped region 104c.

According to another implementation, the mobile carriers associated with the LDMOS current are channeled into a region of the same conductivity type, but a higher conductivity, as the well in which the trench isolation is embedded. This region has a certain distance to the trench isolation region in order to reduce trapping probability and the influence of trapped charge on mobile carriers. More particularly, the higher conductivity region may have an area with a peak concentration due to dopant concentration variations, either intentional or unintentional. This implementation may lower the "on" resistance.

In some embodiments the distance of a peak concentration of this higher conductivity region to the trench isolation region is greater than 10 nm. In some embodiments the distance of a peak concentration of this higher conductivity region to the trench isolation region is greater than 20 nm. In some embodiments the distance of a peak concentration of this higher conductivity region to the trench isolation region is greater than 40 nm. In some embodiments the distance of a peak concentration of this higher conductivity region to the trench isolation region is greater than 60 nm. In some embodiments the distance of a peak concentration of this higher conductivity region to the trench isolation region is greater than 80 nm. In some embodiments the distance of a peak concentration of this higher conductivity region to the trench isolation region is greater than 100 nm.

In some embodiments the distance of a peak concentration of this higher conductivity region to the trench isolation region is less than 100 nm. In some embodiments the distance of a peak concentration of this higher conductivity region to the trench isolation region is less than 80 nm. In some embodiments the distance of a peak concentration of this higher conductivity region to the trench isolation region is less than 60 nm. In some embodiments the distance of a peak concentration of this higher conductivity region to the trench isolation region is less than 40 nm. In some embodiments the distance of a peak concentration of this higher conductivity region to the trench isolation region is less than 20 nm. In some embodiments the distance of a peak concentration of this higher conductivity region to the trench isolation region is less than 10 nm.

Figure 2:
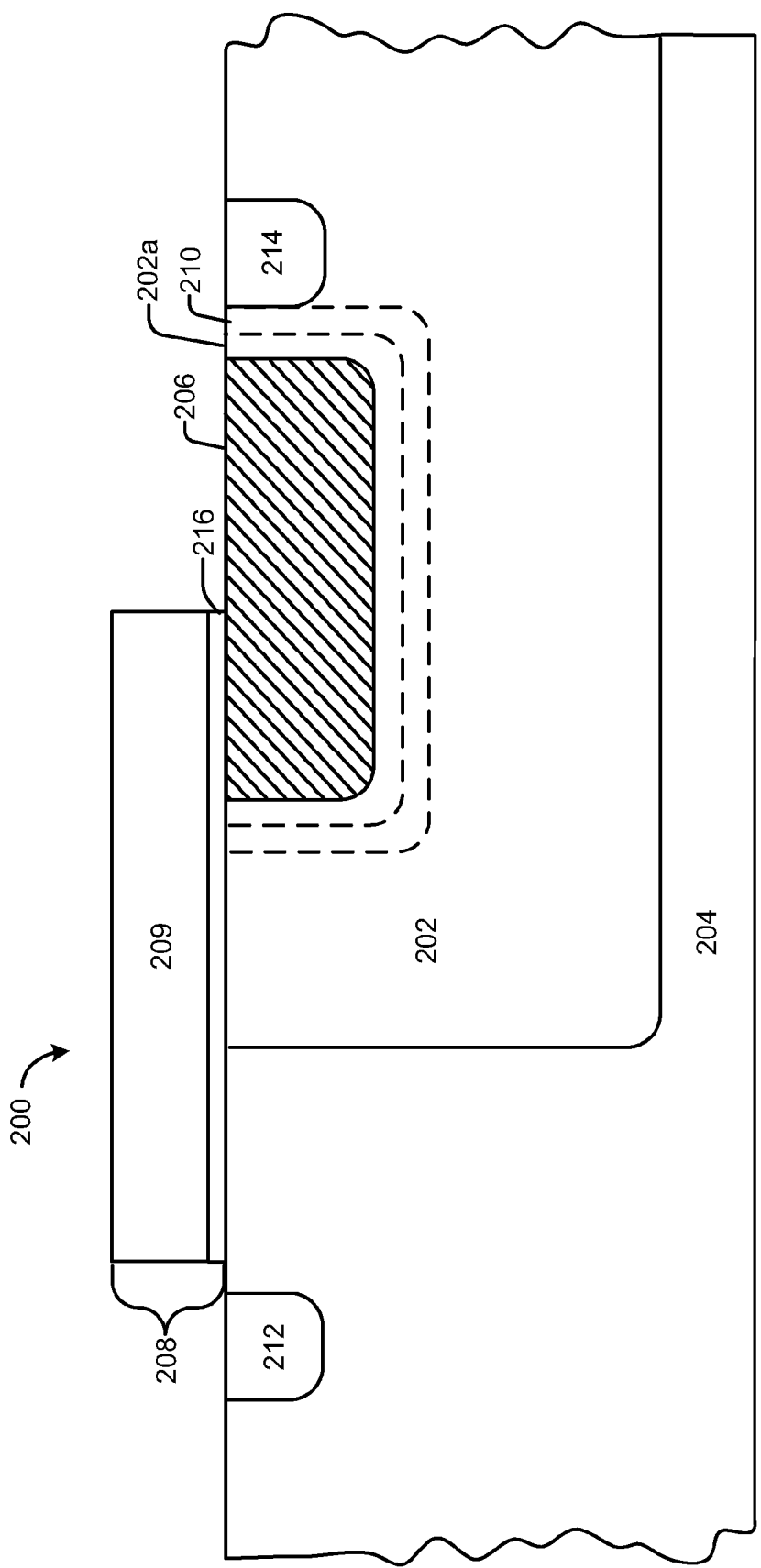
FIG. 2 is a simplified schematic diagram of a semiconductor device, such as a LDMOS device, with a lower ohmic conductive path in the well containing the drain contact.

FIG. 2 shows an LDMOS device 200 that includes a first doped region 202 in a substrate 204. The LDMOS device 200 also includes a trench isolation region 206 and a second doped region 210 within the first doped region 202. The second doped region 210 at least partially surrounds the trench isolation region 206. The second doped region 210 may have the same conductivity type as the first doped region 202 and is configured as a low ohmic path within the first region 202, as the second doped region 210 may have a higher conductivity and/or higher dopant concentration than the first region 202. For example, the first doped region 202 may be doped with phosphorous (P) and the second doped region 210 may be doped with arsenic (As) or another suitable dopant.

In some embodiments the distance of the peak concentration of this higher conductivity region to the trench isolation region is greater than 10 nm. In some embodiments the distance of this higher conductivity region to the trench isolation region is greater than 20 nm. The peak concentration may be due to dopant gradients, either intentional or unintentional, in the higher conductivity region. In some embodiments the distance of the peak concentration of this higher conductivity region to the trench isolation region is greater than 40 nm. In some embodiments the distance of this higher conductivity region to the trench isolation region is greater than 60 nm. In some embodiments the distance of the peak concentration of this higher conductivity region to the trench isolation region is greater than 80 nm. In some embodiments the distance of the peak concentration of this higher conductivity region to the trench isolation region is greater than 100 nm.

In some embodiments the distance of the peak concentration of this higher conductivity region to the trench isolation region is less than 100 nm. In some embodiments the distance of this higher conductivity region to the trench isolation region is less than 80 nm. In some embodiments the distance of the peak concentration of this higher conductivity region to the trench isolation region is less than 60 nm. In some embodiments the distance of the peak concentration of this higher conductivity region to the trench isolation region is less than 40 nm. In some embodiments the distance of the peak concentration of this higher conductivity region to the trench isolation region is less than 20 nm. In some embodiments the distance of this higher conductivity region to the trench isolation region is less than 10 nm.

Similar to LDMOS device 100, LDMOS device 200 generally includes a gate 208, including a gate electrode 209 and a gate dielectric 216, a source region 212, and a drain contact region 214. Substrate 204 may be doped with boron (B) or other suitable p-type dopant. Source region 212 and drain contact region 214 may be doped with arsenic (As), phosphorus (P), or other suitable n-type dopant, which may be introduced into the substrate by diffusion (such as solid state diffusion), ion implantation, plasma doping or other suitable dopant introduction technique. The gate dielectric 216 separates the gate electrode 209 from the substrate 204. The gate electrode 209 may comprise any conductive material. The conductive material may comprise a metallic material. The gate electrode 209 may contain doped poly silicon or silicide or a metal or other suitable material. The gate dielectric layer 216 may comprise at least one of an oxide (such as, silicon dioxide), a nitride (such as a silicon nitride), or an oxynitride (such as silicon oxynitride or nitrided silicon oxide). The gate dielectric 216 may comprise a high-k material (for example, Hafnium oxide HfO2 or Hafnium silicate HfSiON) or other suitable material.

The LDMOS device 200 also includes a first doped region 202, a trench isolation region 206, and a second doped region 210. The first doped region 202 may be doped n-type, may operate as an extended drain region, and may extend beneath the trench isolation region 206, to drain contact region 214 or beyond. The trench isolation region 206 may be formed within the first doped region 202. The dielectric in the trench isolation region may be formed using thermal or plasma oxidation, nitridation, chemical vapor deposition (CVD) or other suitable dielectric formation technique. The second doped region 210, which is of the same doping type of region 202 (e.g. n-type), is formed within the first doped region 202 and may have a higher conductivity and/or a higher dopant concentration than the first doped region 202. The second doped region 210 may be separated from the trench isolation region 206 by a predetermined distance, thus creating a portion 202a of first doped region 202 that extends between the trench isolation region 206 and the second doped region 210. A portion of the second doped region 210 may be configured to be adjacent to the drain contact region 214 of the LDMOS. Thus, a low ohmic (i.e. high conductivity) path is created to the drain contact region 214. Alternatively, the drain contact region 214 may be adjacent to, or separated from, second doped region 210. Likewise, the drain contact region 214 may alternatively be adjacent to, or in contact with, the trench isolation region 206 and/or portion 202a.

The first and second doped regions 202 and 210 have been described as having an n-type conductivity such that the device is configured to operate as an nLDMOS; however, one skilled in the art will notice that the device may similarly be formed as a pLDMOS by forming the respective regions with the opposite conductivity as shown. Additionally, substrate 204 is shown as continuous, however, similar to the implementation shown in FIG. 1B, the substrate may comprise a base substrate portion and a device substrate portion formed upon the base substrate portion.

According to another implementation, the effect (e.g. noise) of the traps in a trench isolation region and/or at a semiconductor to trench isolation region interface is reduced by reducing or avoiding the generation of traps or by quenching traps that are formed during processing.

Figure 3:
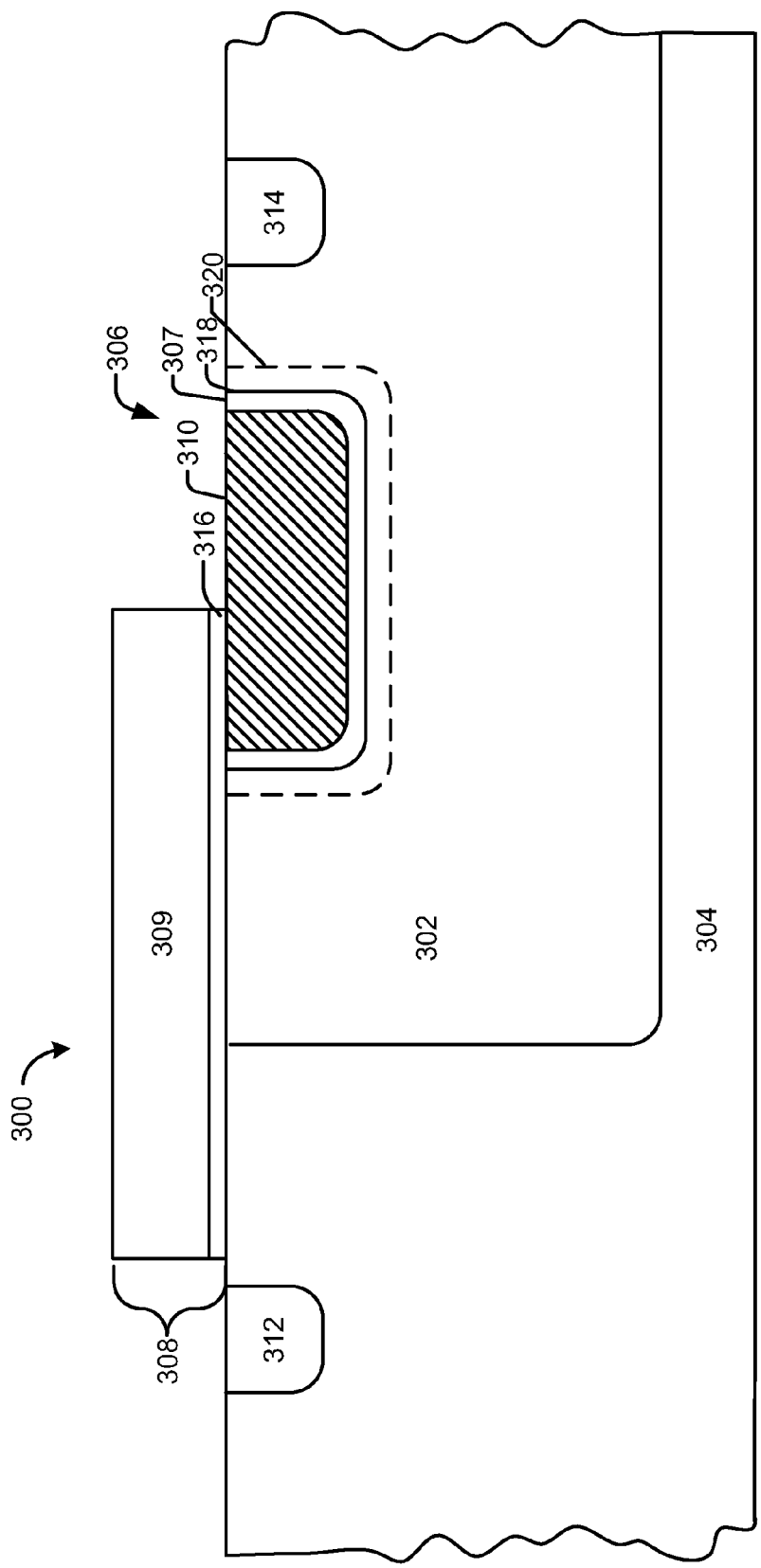
FIG. 3 is a simplified schematic diagram of a semiconductor device, such as an LDMOS device, with a trench dielectric containing a reduced amount of traps compared to conventional devices.

FIG. 3 shows an LDMOS device 300 that includes a doped region 302 formed in a semiconductor substrate 304. The device 300 also includes a trench isolation region 306, which may have a first portion 307 and a second portion 310, the first portion 307 between the doped region 302 and the second portion 310 of the trench isolation region 306. The dielectric in the trench isolation region 306 may be formed using thermal or plasma oxidation, nitridation, chemical vapor deposition (CVD) or other suitable dielectric formation techniques to form a single layer or multiple layers, as shown in FIG. 3 via the first portion 307 and the second portion 310. For example, the first portion 307 and/or the second portion 310 may be formed of an oxide, a nitride, or other dielectric material and may be formed using plasma (e.g. plasma oxidation), thermal (e.g. thermal oxidation), or other suitable formation techniques. Each portion may have a single layer or may consist of multiple layers of, for example, dielectric materials. In some embodiments, the first portion 307 may be formed of an oxide, as e.g. silicon oxide.

At least a portion of the trench isolation region 306 may include a noise reducing agent such as a halogen element or deuterium. The halogen element may include chlorine, fluorine, or other suitable halogen element. The noise reducing agent may be introduced into the trench isolation region 306 through diffusion (such as solid state diffusion), ion implantation, plasma doping or other suitable technique. An oxide layer or nitride layer (not shown) may also be formed between the first portion 307 and the second portion 310 of trench isolation region 306.

According to one implementation, the introduction of the noise reducing agent may be performed after forming the trench and before forming the first portion 307 inside the isolation trench (as defined by trench edge 318). The noise reducing agent may be introduced via ion implantation, plasma doping or solid-state diffusion. The halogen elements or noise reducing dopants may be compound dopants containing fluorine, chlorine or any other halogen element. Additionally or alternatively, $BF_2$, $BF_3$, $BCl_3$, $AsF_3$, $AsF_5$, $PF_3$, $PF_5$, or respective ions of these materials generated in a plasma, or other suitable compound dopants may be introduced into the doped region 302 by, for example, plasma doping prior to forming the trench isolation region 306. Compared to ion implantation, plasma doping may show the advantage of better conformal doping of the vertical sidewalls of the trench and may offer high doping concentration in thin layers and high processing throughput of the devices. The trench isolation region 306 or at least the first portion 307 of the trench isolation region 306 may then be formed. During the formation process, or by an annealing process after the trench isolation region 306 or at least the first portion 307 of the trench isolation region 306 is formed, at least a portion of the noise reducing agent may be introduced into the dielectric layer 307 or at the interface, e.g. the edge 318 of the trench, between the trench isolation region 306 and the doped region 302. Moreover, if the compound dopant has an opposite conductivity with regard to doped region 302, a PN junction 320 is formed, which may enhance the noise reducing quality of the device 300 as described above with reference to FIG. 1.

Additionally or alternatively, the noise reducing agent may be introduced after forming the trench isolation region 306 or at least the first portion 307 of the trench isolation region 306. Thus, the first portion 307 of the trench isolation region 306 may be formed as a dielectric layer within the trench defined by trench edge 318, through thermal oxidation or a plasma oxidation using a Kr/O2 plasma oxygen radical at a temperature between 300° C. and 600° C. In some embodiments the thickness of the first portion 307 of the trench isolation region 306 is 50 nm. In some embodiments the thickness of the first portion 307 of the trench isolation region 306 is 30 nm. In some embodiments the thickness of the first portion 307 of the trench isolation region 306 is 20 nm. In some embodiments the thickness of the first portion 307 of the trench isolation region 306 is 15 nm. In some embodiments the thickness of the first portion 307 of the trench isolation region 306 is 10 nm. In some embodiments the thickness of the first portion 307 of the trench isolation region 306 is 5 nm or thinner. The oxide may then be treated using plasma fluoridation in a $CF_4$ plasma or by using plasma doping with fluorine (F).

The LDMOS device 300 also generally includes a gate 308, source region 312, and drain contact region 314. Substrate 304 may be doped with boron (B) or other suitable p-type dopant. Source region 312, drain contact region 314, and doped region 302 may be doped with arsenic (As), phosphorus (P), or other suitable n-type dopant, which may be introduced into the substrate by diffusion (such as solid state diffusion), ion implantation, plasma doping or other suitable dopant introduction technique. The gate 308 may include a gate dielectric 316 that separates a gate electrode 309 from the substrate 304. The gate electrode 309 may comprise any conductive material. The gate electrode 309 may consist of doped poly silicon, silicide, metal or other suitable material. The gate electrode 39 may comprise a metallic material (such as a pure metal or metal alloy). The gate dielectric layer 316 may comprise an oxide (such as silicon dioxide), and nitride (such as silicon nitride), an oxynitride (such as silicon oxynitride or nitrided silicon oxide). The gate dielectric layer 316 may comprise a high-k material (e.g. Hafnium oxide HfO2 or Hafnium silicate HfSiON) or other suitable material. Although the drain contact region 314 is shown as separated from the trench isolation doped region 306 and PN junction 320, the drain contact region 314 may alternatively be adjacent to, or in contact with, the trench isolation region 306 and/or the PN junction 320.

Exemplary Method

According to another implementation, the trench isolation region, the doped semiconductor region, or the interface between the semiconductor and the trench isolation region trench is configured to reduce electrical noise, such as low frequency noise that may be caused by traps, in the LDMOS device. For example, the interface between the semiconductor and the trench isolation region (i.e. surface of the semiconductor forming the trench isolation trench) may be provided with a reduced surface roughness that may avoid the generation of traps or that may lead to a reduced generation of traps.

Figure 4:
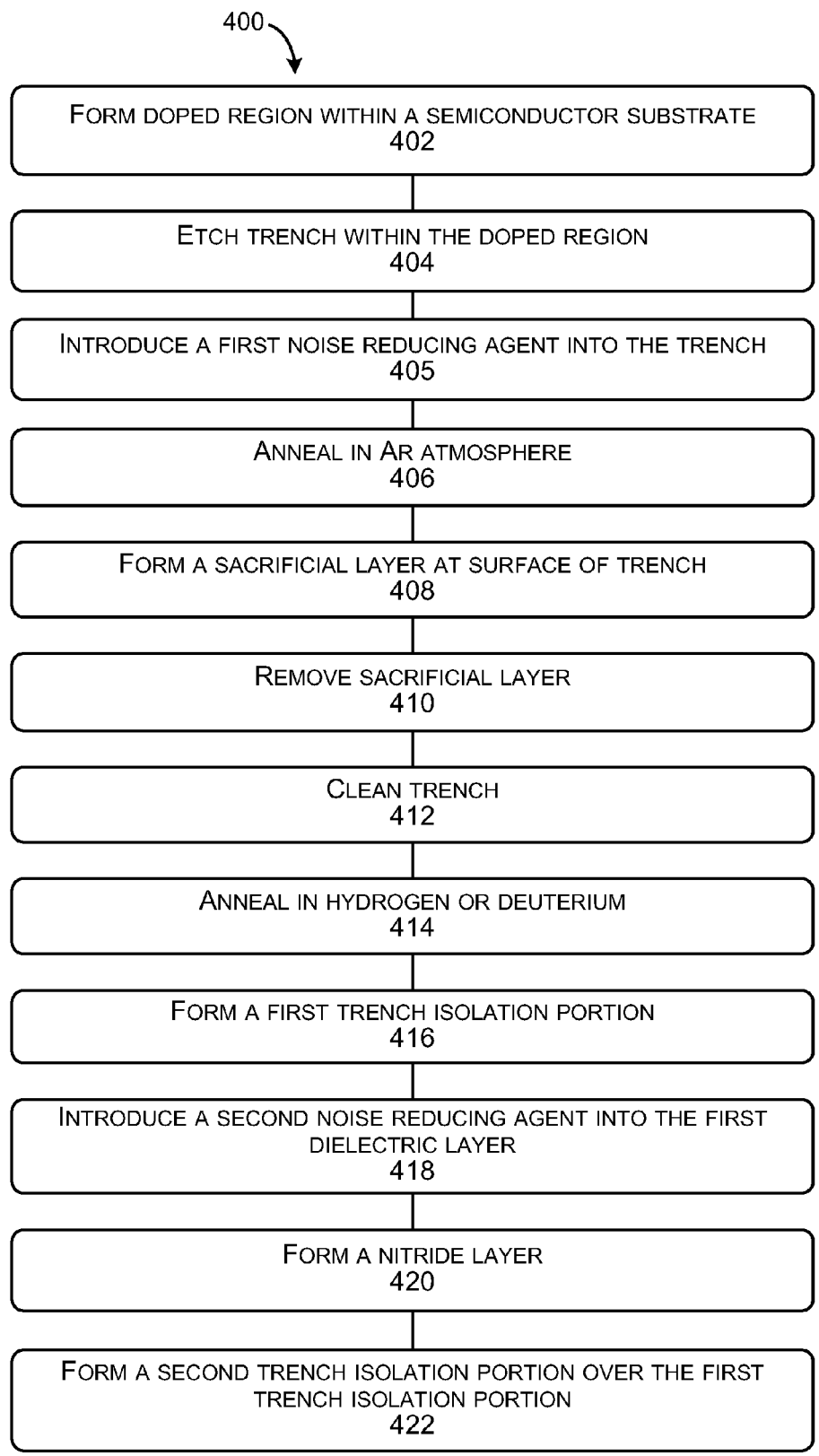
FIG. 4 is a flow diagram for creating a semiconductor device, such as an LDMOS device.

FIG. 4 illustrates a method 400 for creating an LDMOS device incorporating techniques to decrease low frequency noise. Specifics of exemplary methods are described below. However, it should be understood that certain acts need not be performed in the order described, and may be modified, and/or may be omitted entirely, depending on the circumstances. The method 400 will be described by way of example with reference to FIGS. 1 and 3.

At 402, a doped region is formed within a semiconductor substrate. For example, an n-doped region 302, or n-well, may be formed in a substrate 304. The dopant may be introduced by diffusion (such as solid state diffusion), ion implantation, plasma doping or other suitable method of dopant introduction.

At 404, a trench is etched. The etching may be by plasma etching or other suitable techniques within the doped region. The trench may be etched according to known techniques. For example, the substrate may be suitably masked and etched to create a trench as defined by trench edge 318.

At 405, a first noise reducing agent may be introduced into the trench. The noise reducing agent may be a dopant agent and may be (or may include) F, Cl, BF2, BF3, BCl3, AsF3, AsF5, PF3, PF5 or a respective ion of these materials generated in a plasma. For doping the sidewalls of the trench the noise reducing agent needs to be implanted under an angle as shown and described with respect to FIGS. 5A and 5B.

Figure 5A:
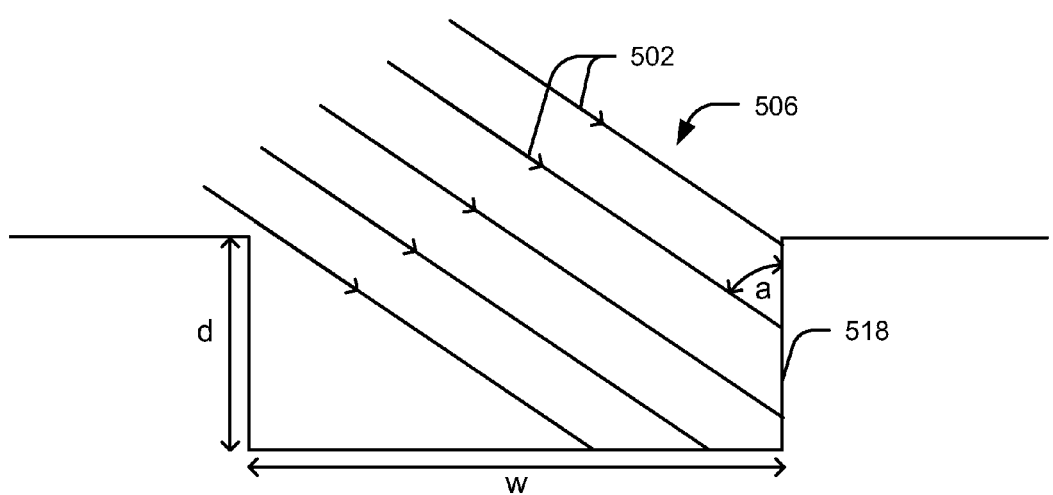
FIG. 5A and FIG. 5B show the introduction of noise reducing agents into the trench sidewalls according to some embodiments of the invention.
Figure 5B:
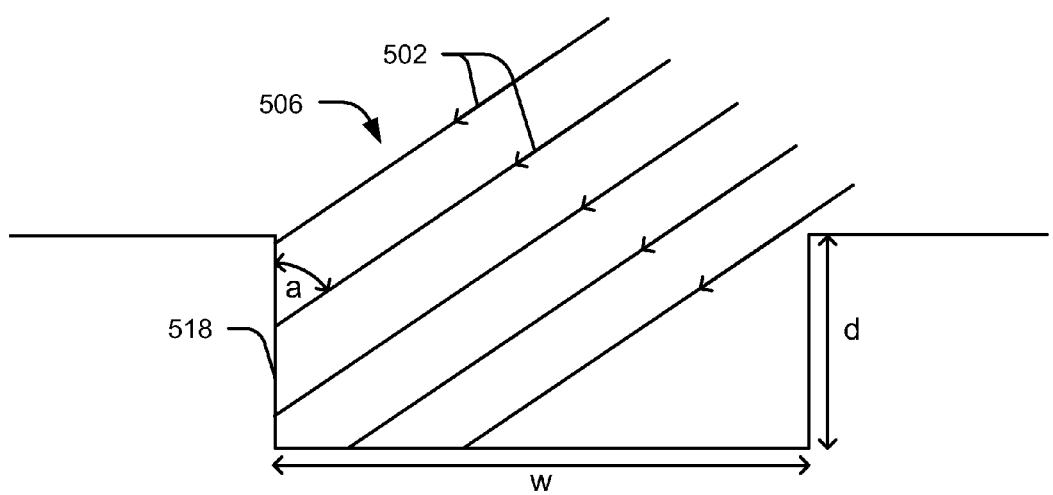

FIG. 5A is a cross-sectional view through the trench 506 showing an ion beam (designated using arrows 502) enabling implantation of a dopant into the trench sidewalls (along the current path) according to some embodiments. In some embodiments, the implantation beam is incident on the trench sidewall at an implantation angle "a" to the vertical axis of the trench. Implantation angle "a" is selected according to the depth "d" and the width "w" of the trench and is determined by the equation tan(a)=w/d.

In some embodiments, implantation could be either a dual mode or a quad mode operation. A dual-mode is an implant mode having two separate implantations performed on the trench sidewalls 518 using an ion beam. In this mode, semiconductor wafer is first implanted with the noise reducing agent (FIG. 5A) and then semiconductor wafer is rotated by 180° about its vertical axis, following with another implantation (FIG. 5B) which is performed on the opposite sidewall that was not implanted during the first implant. A quad-mode operation is an implant mode having four separate implantations performed on the trench using an ion beam. In embodiments according to this mode, semiconductor wafer is first implanted with the noise reducing agent and then semiconductor wafer is rotated by 90° about its vertical axis followed by an implantation with the noise reducing agent. The implantation mode continues with two more rotations by increments of 90°, each followed by a further implantation. The above-described method of rotating semiconductor wafer in a dual-mode or a quad-mode is used to ensure that the trench sidewalls of all LDMOS devices with a certain orientation are implanted. In the case that the gates of different LDMOS transistors on one substrate are rotated by 90° a quad-mode implant is necessary. In the case the LDMOS transistors have all the same direction for the gate a dual-mode implant is sufficient that implants the trench sidewalls that are parallel to the gate electrode finger.

At 406, the device 300 is annealed. More particularly, the device 300 may be annealed in an Argon (Ar) atmosphere at a temperature of, for example between 1100 and 1300° C. for 10 to 60 minutes. Examples of temperature include, but not limited to, 1100° C., 1200° C., and 1300° C. Examples, of time period include, but not limited to, 10 minutes, 20 minutes, 30 minutes, 40 minutes, 50 minutes and 60 minutes. This annealing repairs crystal damage to the semiconductor substrate 304 and may lead to a smooth crystal surface on an atomic scale.

At 408, a sacrificial layer is formed on a surface of the trench (as defined by trench edge 318). For example, a sacrificial oxide having a thickness of 3 to 10 nm is formed by thermal oxidation or by plasma oxidation using a $Kr/O_2$ plasma.

At 410, the sacrificial layer is removed. The sacrificial layer may be wet etched using an HF and HCl solution or with HF vapor cleaning. Subsequent steps may be performed in the same processing chamber as this sacrificial layer removal to avoid undesired native oxide formation, which may contribute to trap formation.

At 412, the trench (as defined by trench edge 318) is cleaned. For example, the trench may be cleaned with ammonia hydrogen peroxide water ($NH_4OH:H_2O_2$:deionized water) containing a relatively small alkaline amount for a reduced surface roughness.

At 414, the trench (as defined by trench edge 318) is annealed in a hydrogen or deuterium atmosphere. The anneal may be performed at a temperature of between 700 and 900° C. for a period of between 1 to 10 minutes. The trench may have a surface roughness of 5 angstroms or less, the surface roughness may be determined by calculating the standard deviation of surface elevation (i.e. local surface height) associated with a 50 nm×50 nm area or calculating the standard deviation of height of a cross section line through the trench semiconductor surface. According to another implementation, the trench may have a surface roughness of 1 angstrom or less. According to another implementation, the trench may have a surface roughness of 0.5 angstroms or less.

At 416, a first trench isolation portion is formed at the surface of the trench. The first trench isolation portion may be a dielectric layer. The dielectric layer may comprise any dielectric material. The dielectric layer may comprise at least one of an oxide (such as silicon dioxide), a nitride (such as silicon nitride), an oxynitride (such as silicon oxynitride or nitrided silicon oxide). The dielectric layer may comprise a high-k material (e.g. hafnium oxide HfO2 or hafnium silicate HfSiON) or other suitable material, in contact with the semiconductor surface of the trench (as defined by trench edge 318). The first trench isolation portion may be formed through thermal oxidation or a plasma oxidation using a Kr/O2 plasma oxygen radical oxidation at a temperature between 300° C. and 600° C. Alternatively, a thermal oxidation process may be used.

In some embodiments the thickness of the first portion of the trench isolation region is 50 nm or less. In some embodiments the thickness of the first portion of the trench isolation region is 30 nm or less. In some embodiments the thickness of the first portion of the trench isolation region is 20 nm or less. In some embodiments the thickness of the first portion of the trench isolation region is 15 nm or less. In some embodiments the thickness of the first portion of the trench isolation region is 10 nm or less. In some embodiments the thickness of the first portion of the trench isolation region is 5 nm or less.

If thermal oxidation techniques are used, higher processing temperatures are preferred. If lower temperatures are used, a stress relieve anneal may be used to reduce the amount of traps generated due to mechanical stress (e.g., lattice deformation due to lattice constant mismatch between the semiconductor (e.g. silicon) and the dielectric layer of the trench). The stress relieve anneal may be performed using rapid thermal anneal, spike anneal or laser annealing at a temperature of between 900 and 1200° C. for a period of between 1 and 60 seconds. Examples of temperatures include, without limitation, 900° C., 950° C., 1000° C., 1050° C., 1100° C., 1150° C., and 1200° C. Examples of time period include, without limitation, 1 second, 5 seconds, 10 second, 20 second, 30 seconds, 40 seconds, 50 seconds and 60 seconds.

At 418, a second noise reducing agent, such as a halogen element or deuterium may be introduced into the first dielectric layer in the manner discussed above. For example the fluorine may be introduced by a CF4 plasma process or fluorine may be introduced through a plasma doping process. According to certain embodiments, the second noise reducing agent may be similar to, or the same as, the first noise reducing agent and may be introduced in a similar or different manner than the first noise reducing agent. The noise reducing agent may be introduced after the first trench isolation portion is completely formed or may alternatively be introduced during the formation of the first trench isolation portion. As one example of this alternative, a portion of the first trench isolation portion may be formed followed by an introduction of a noise reducing agent. Subsequently, a further portion of the first trench isolation portion may be formed followed by a further introduction of the noise reduction agent, and so forth. Thus, the noise reducing agent may have a homogeneous profile, a graded profile, or other desired distribution.

At 420, a nitride layer may be formed with a thickness between 5 and 50 nm.

At 422, a second trench isolation portion is formed over the first trench isolation portion (or the nitride layer formed in step 420, for example by a CVD process). A stress relieve anneal may be performed subsequent to forming the second trench isolation portion. Additionally, the gate dielectric layer, the gate electrode, the source region and the drain contact region of the LDMOS device may then be formed.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

What is claimed is:

1. A semiconductor device comprising:
a first doped region within a semiconductor substrate to operate as an extended drain region;
a trench isolation region, the trench isolation region comprising a noise reducing agent, and the trench isolation region comprising a first portion and a second portion, the first portion between the semiconductor substrate and the second portion, at least the first portion comprising the noise reducing agent; and
a second doped region configured to reduce noise and located between the first doped region and the trench isolation region, wherein the trench isolation region and the second doped region are at least partially formed within the first doped region.

2. The device according to claim 1, wherein the first doped region has an opposite conductivity type as the second doped region.

3. The device according to claim 1, wherein a space charge region extends between the second doped region and the first doped region.

4. The device according to claim 1, wherein the trench isolation region and the second doped region are formed entirely within the first doped region.

5. The device according to claim 1, wherein the noise reducing agent comprises a halogen element or deuterium.

6. The device according to claim 1, wherein the semiconductor substrate comprises a base substrate portion and a device substrate portion.

7. The device according to claim 6, wherein the device substrate portion comprises an epitaxial layer.

8. The device according to claim 1, wherein said semiconductor device is an LDMOS device.

9. A semiconductor device, comprising:
a first doped region to operate as an extended drain region;
a trench isolation region; and
a second doped region within the first doped region and at least partially surrounding the trench isolation region, the first and second doped regions having the same conductivity type, the second doped region having a higher conductivity than the first doped region, at least a portion of the second doped region in direct contact with said drain contact region.

10. The device according to claim 9, wherein a peak concentration of the second doped region is separated from the trench isolation region by at least 10 nm.

11. The device according to claim 9, wherein said semiconductor device is an LDMOS device.

12. The device according to claim 9, wherein at least a portion of the second doped region is adjacent to a drain contact region.

13. A semiconductor device, comprising:
a doped region;
a trench isolation region at least partially within the doped region, at least a portion of the trench isolation region comprising a noise reducing agent, and wherein the trench isolation region comprises a first portion and a second portion, the first portion between the semiconductor substrate and the second portion, at least the first portion comprising the noise reducing agent; and
another doped region configured to reduce noise and located between the doped region and the trench isolation region, wherein the trench isolation region and the another doped region are at least partially formed within the doped region.

14. The device according to claim 13, wherein the noise reducing agent comprises a halogen element or deuterium.

15. The device according to claim 13, wherein the noise reducing agent comprises chlorine or fluorine.

16. The device according to claim 13, wherein the device is an LDMOS device.

17. A method of forming a trench isolation region in a Lateral Diffused Metal Oxide Semiconductor (LDMOS) device, the method comprising:
forming a doped region within a semiconductor substrate, the doped region being of a first conductivity type;
introducing into the doped region a noise reducing agent and a dopant of an opposite conductivity type as the doped region;
forming a trench isolation region within the doped region, at least one of the trench isolation region or an interface between the trench isolation region and the doped region configured to reduce low frequency noise in the LDMOS device, the forming the trench isolation region comprising forming a first dielectric portion and forming a second dielectric portion; and
introducing a noise reducing agent into the first dielectric portion prior to forming the second dielectric portion.

18. The method according to claim 17, wherein forming a trench isolation comprises forming a trench surface with a surface roughness of less than 5 angstroms.

19. The method according to claim 17, further comprising introducing a noise reducing agent in the trench before forming a dielectric layer in the trench region.

20. The method according to claim 19, wherein introducing the noise reducing agent comprises a plasma doping process.

21. The method according to claim 19, wherein introducing the noise reducing agent comprises an ion implantation process.

22. The method according to claim 19, wherein the noise reducing agent comprises fluorine.

23. The method according to claim 19, wherein the noise reducing agent comprises chlorine.

24. The method according to claim 19, wherein the noise reducing agent comprises deuterium.

25. The method according to claim 17, wherein forming the trench isolation region comprises etching a trench into the semiconductor substrate and forming at least one dielectric material within the trench, the method further comprising annealing in an argon atmosphere after etching the trench into the semiconductor substrate and before forming the dielectric material.

26. The method according to claim 17, wherein forming the trench isolation region comprises forming a first dielectric portion and forming a second dielectric portion, the method further comprising annealing in a hydrogen or deuterium atmosphere prior to forming the first dielectric portion of the trench isolation region.

27. The method according to claim 17, wherein forming the trench isolation region comprises forming a first dielectric portion and forming a second dielectric portion, wherein the first dielectric portion of the trench isolation region is formed by plasma oxygen radical oxidation using a $Kr/O_2$ plasma.

28. The method according to claim 17, wherein prior to forming a dielectric layer in the trench region, the method further comprises:
   growing a sacrificial oxide layer using a Kr/O2 plasma; and
   removing the sacrificial oxide layer after introducing a noise reducing agent in the trench region.

29. The method according to claim 17, wherein forming the trench isolation region comprises forming a first dielectric portion and forming a second dielectric portion, the method further comprising forming a nitride layer over the first dielectric portion of the trench isolation region prior to forming the second dielectric portion of the trench isolation region.

* * * * *